BROAD-BAND FM MODULATOR

Filed April 20, 1966 2 Sheets-Sheet 1

INVENTORS
RICHARD W. BROUNLEY
NEVILLE L. DOWNS
BY
Hopgood & Calimafde
ATTORNEYS

INVENTORS
RICHARD W. BROUNLEY
NEVILLE L. DOWNS
BY
Hopgood & Calimafde
ATTORNEYS

United States Patent Office
3,458,834
Patented July 29, 1969

3,458,834
BROAD-BAND FM MODULATOR
Richard W. Brounley and Neville L. Downs, St. Petersburg, Fla., assignors to Electronic Communications, Inc., a corporation of New Jersey
Filed Apr. 20, 1966, Ser. No. 543,891
Int. Cl. H03c 3/00; H03b 3/04; H04b 1/04
U.S. Cl. 332—19 3 Claims

ABSTRACT OF THE DISCLOSURE

A highly stable broad-band FM modulator is described wherein a modulatable FM oscillator is modulated with audio signals of a selected bandwidth. The oscillator is stabilized by sampling the modulated output at a rate falling within the passband of the audio signals and the comparison is performed between the sampled oscillator signals and a reference oscillator. The comparison signal, after synchronous detection, is passed through a low pass filter having a time constant of a duration necessary to reduce the beat signal occurring between the audio signals and the comparison signal to less than a preselected percentage of the peak deviation of the FM oscillator source. Specifically the FM oscillator is sampled at a rate of approximately 1.4 kc. and thus permits a general reduction in the size and weight of components used in the control loop for stabilizing the FM oscillator source.

Our invention relates to FM systems and techniques and is particularly useful in providing inherent center-frequency stability, over a wide range of input modulating frequencies.

Requirements for FM systems have been becoming increasingly tight, particularly in telemetry systems, in which it is desired to accomplish frequency stability within ±0.005 to ±0.001 percent of the assigned transmitter carrier. At the same time, wide deviation at modulating frequencies from D-C to 1 mc./s. is desired. But since the attainment of high stability and wide-band FM are basically contradictory in nature, a true solution to the problem is indeed formidable, utilizing existing or known techniques.

For example, one standard technique to achieve a stable FM system is by simple phase-modulation to FM conversion, but this method is severely limited when low modulation frequencies are desired. Another approach to the problem is to use a voltage-controlled crystal oscillator, followed by an appropriate multiplication scheme; but this method is inherently limited by the narrow bandwidth of the crystal and by external circuit anomalies; and, regardless of existing techniques to further enhance deviation and frequency response, the basic contradiction (of frequency stability versus modulation capability) cannot be overcome. A third technique utilizes carefully controlled tolerances, selection of temperature-compensated elements, and oven control, but the method is subject to component-aging and other long-term drift problems. A fourth method contemplates AFC loops for stabilizing a voltage-controlled oscillator, utilizing mixing techniques which may improve stability at the cost of introducing spurious problems and wide percentage-deviation requirements.

A basic AFC scheme alternately gates a voltage-controlled oscillator and a crystal-reference frequency to a frequency discriminator, producing an output having a D-C component representing the center frequency of the discriminator, and an A-C component which is a square wave at the sample frequency; the peak-to-peak amplitude of the square wave represents the instantaneous frequency difference between the two oscillators. The D-C component in the A-C output of a loop amplifier is resolved by a synchronous detector; this D-C component is then used to determine polarity and magnitude of corrective tuning of the FM oscillator. A major disadvantage of this system lies in the fact that the sampling rate must be about one-tenth the lowest modulation rate; otherwise, errors will be introduced into the loop at low modulation frequencies.

It is, accordingly, an object of the invention to provide an improved FM modulator and method.

Another object is to meet the above object with a modulator and method that provide inherent stability over a wide range of input modulating frequencies, extending all the way to D-C.

A further object is to provide a basically simple frequency-stabilizing technique for an FM modulator, enabling acceptance of input frequencies from D-C to the video range, and with crystal-oscillator frequency stability.

A specific object is to provide a stabilizing technique for an FM oscillator, utilizing sampling of a crystal-reference frequency in alternation with FM oscillator output, inherently capable of accepting input modulating signals in a frequency range which includes the sampling frequency.

Other objects and various further features of novelty and invention will be pointed out or will occur to those skilled in the art from a reading of the following specification in conjunction with the accompanying drawings. In said drawings, which show, for illustrative purposes only, a preferred form of the invention:

Figures 1, 3:
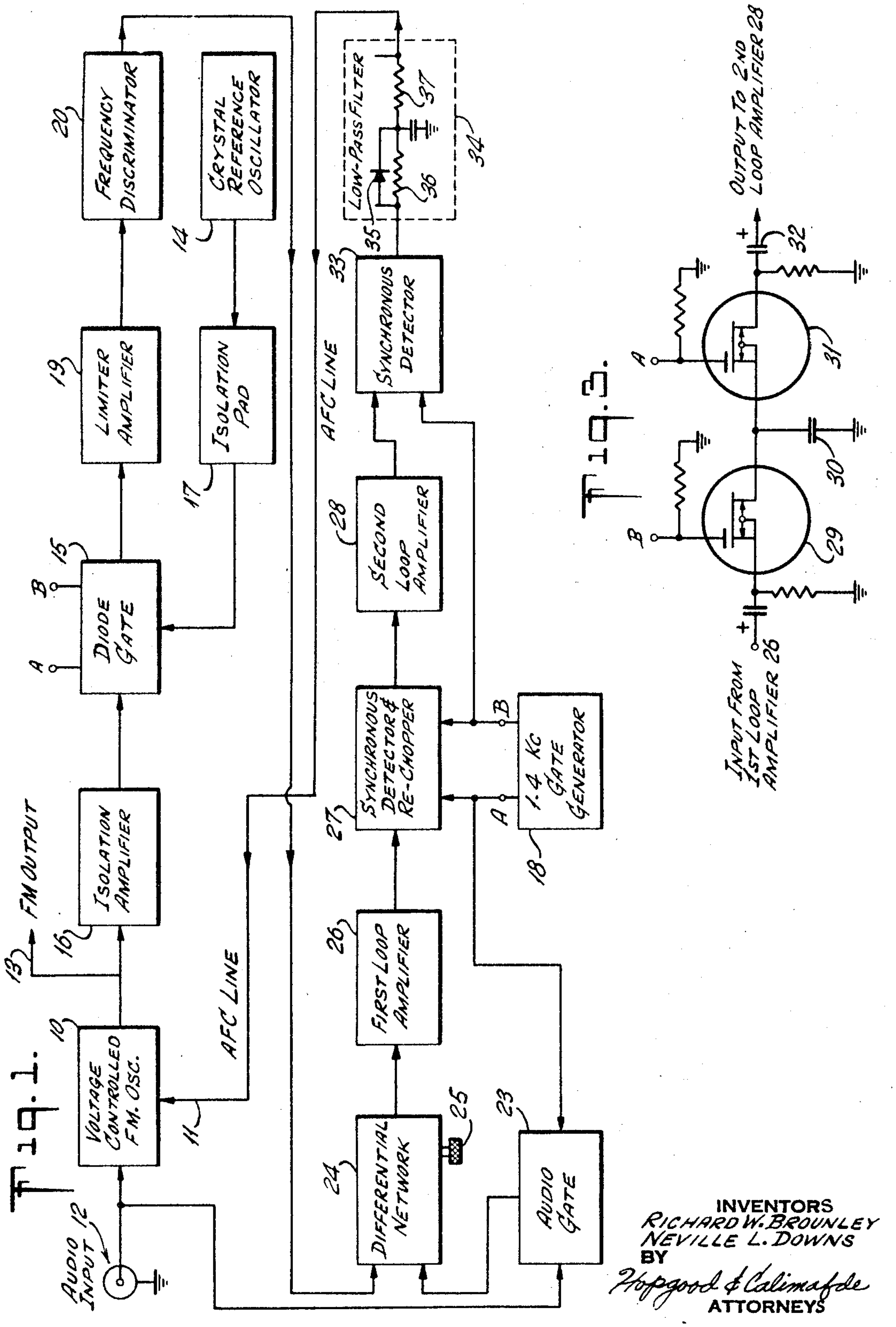
FIG. 1 is an electrical circuit block diagram schematically showing functional elements of the invention.
FIG. 3 is a detailed circuit diagram for certain elements of FIG. 1.

Briefly stated, our invention contemplates modification of an improvement over the above noted gating technique, in a manner which permits the sampling rate not only to be chosen independent of the lowest input modulating frequency but also extends the input frequency response down to D-C. This is attained by means of a cancellation technique which effectively removes any modulating-frequency components within the AFC loop, thus permitting high-gain amplification (without saturation) in the loop.

Referring to the drawings, the invention is shown in application to an FM oscillator 10, the center frequency of which is to be stabilized by a corrective tune-control signal to be made available in line 11, labeled "AFC Line." A source of input modulating signal for oscillator 10 is suggested at 12 and is labeled "Audio Input," although it will be understood that the frequency structure of this input signal may extend well above and below the autible spectrum. The FM output of oscillator 10 is suggested at 13.

The center frequency of oscillator 10 is to be tightly slaved to that of a reference-frequency source 14, which may be a crystal reference oscillator. Sampling means in the form of a diode gate 15 alternates its sampling of input signals (a) from FM oscillator 10 and (b) from crystal reference oscillator 14, and suitable isolation means at 16–17 are shown in these respective sampling inputs, to assure against generation of frequency errors while the difference or error between frequencies of oscillators 16–14 is being sampled in accordance with the invention.

The sampling at 15 is regularly repetitive at a frequency very substantially below the desired center frequency of the oscillator 10. In a specific embodiment, for example, the center frequency at 10 was 83.3 mc./s., the crystal at 14 being operated at its fifth overtone to produce this frequency; on the other hand, the sampling rate generator 18, having output connections A–B to gate 15, was operated at 1.4 kc./s.

Figure 2:
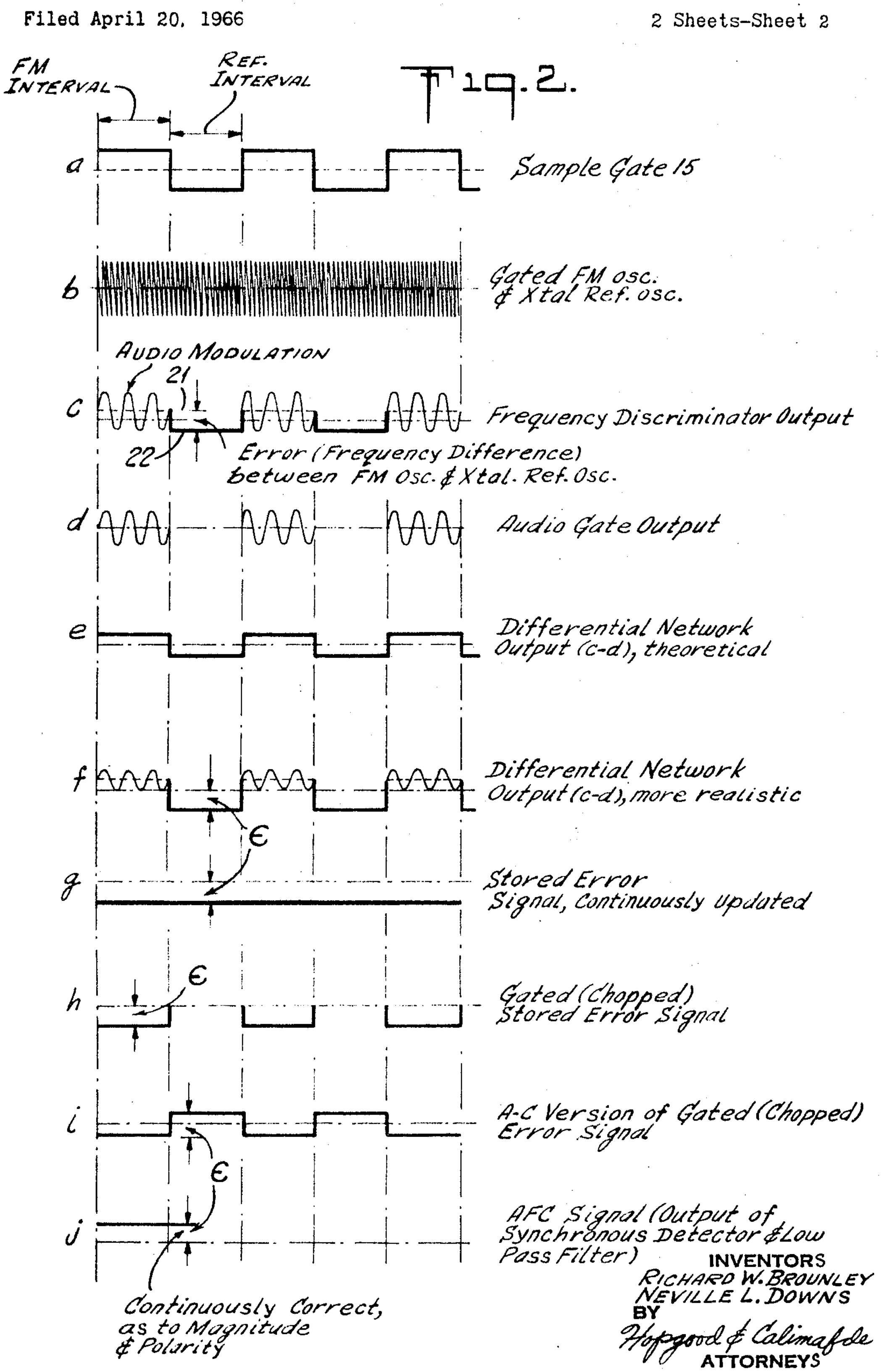
FIG. 2 is a diagram graphically depicting various voltage functions appearing in the circuit of FIG. 1, all plotted on the same time base.

So that signal-processing may be followed along with the description of parts, additional reference will be made to FIG. 2, in which curve *a* depicts the sampling-control function to gate 15 and curve *b* depicts the gate output, containing FM oscillations in the positive-gate intervals and crystal-reference oscillations during the negative-gate intervals. It is these signals which, after amplitude-limiting at 19, are supplied to a frequency discriminator or FM detector 20. The output of the discriminator 20 will have the general appearance of FIG. 2*c*, wherein "audio" modulation is seen to characterize the frequencies detected during the FM-sampling interval, and wherein a steady voltage level reflects the constant-frequency output of crystal oscillator 14, as viewed in the reference-sampling intervals. The detected "audio" modulations are with respect to a base line 21 which reflects the instantaneous center frequency of FM oscillator 10, and the instantaneous difference between level 21 and the detected crystal-oscillator level 22 represents the frequency difference or error (E) between the oscillator frequencies.

In accordance with the invention, another gate or sampling means 23 is caused to sample the modulating ("audio") input signal, in synchronism with the FM intervals of sampling at 15. The "audio" signal, thus gated, will have the appearance shown in FIG. 2*d*. This gated "audio" signal is used to effectively cancel the "audio" modulations appearing at the output of discriminator 20, and a differential network 24 is shown for the purpose, having two inputs continuously supplied, respectively, by FM detector 20 and "audio" gate 23. Adjustable means is suggested at 25 for trimming the level of one of the network inputs at 24, to produce maximum cancellation of the "audio" signal. With theoretically perfect cancellation, the output of network 24 will have the square-wave appearance of FIG. 2*e*. However, after high gain (less than saturation) in a first loop amplifier 26, the signal may more realistically have an "audio" ripple in the FM-sampling intervals, as suggested (but not necessarily accurately portrayed) in FIG. 2*f*.

The block 27 in FIG. 1 suggests that the output of the first loop amplifier 26 is subjected to synchronous detection and re-chopping, in accordance with the sampling rate signals available from generator 18. These functions prevent any frequency shift from occurring during modulation under conditions of imperfect cancellation (at 24), and the functions become more clear from a consideration of the components of block 27, as shown in FIG. 3. As indicated in FIG. 2*f*, the signal output from the first loop amplifier 26 may have some residual "audio" modulation during the FM oscillator sampling time. The purpose of the synchronous detector and chopper (FIG. 3) is to remove any such modulation before it might otherwise be amplified (at a second loop amplifier 28) to a level sufficient to cause saturation. The saturation effect results in frequency offset with modulation.

In FIG. 3, a first field-effect transistor 29 is gated "on" (by gate generator output B) during the reference oscillator sampling period or time slot, and the peak error signal ($\epsilon$) is stored in a nonpolarized capacitor 30.

The gate-generator output A gates a second similar transistor 31 to "off" condition during this same time slot. The crystal-reference frequency thus sampled contain no modulation superposed on the error signal ($\epsilon$), and so the voltage impressed on capacitor 30 is a "clean" D-C, representing the error. Since the output of amplifier 26 is not sampled to capacitor 30 during the FM sampling interval, no "audio" modulating component appears at 30. The chopping function is produced by the action of transistor 31 during the FM oscillator time slot, by connecting its output to the second loop amplifier 28 during the FM sampling interval. Capacitance-coupling at 32 assures that the input to amplifier will be an A-C square wave (FIG. 2*i*), developed from the stored error signal, which is continuously updated as to magnitude and polarity (FIG. 2*g*) and then chopped (FIG. 2*h*). The amplitude and phase of the A-C version of the chopped error signal (FIG. 2*i*) thus reflects the instantaneous polarity and magnitude of the frequency difference between oscillators 10–14.

It will be noted that "audio" frequency cancellation by the techniques described in connection with circuits 24 and 27 (FIG. 3) is effective to remove all trace of modulation frequencies above approximately 1 c.p.s. From 1 c.p.s. down to D-C, the frequency-response of the modulator (at 10) depends upon the degree of cancellation (at 24); for the pure D-C modulating condition, the absolute frequency of the modulator also depends upon the degree of cancellation.

Having subjected the chopped (A-C) version of the pure error signal to high gain amplification at 28, it is detected at 33 in synchronism with the chopping rate, as suggested by the connection of detector 33 to the B output of gate generator 18. The resulting signal, after low-pass filtering at 34 (to remove any trace of a chopping-rate frequency component), becomes the AFC signal which is supplied in line 11 in corrective-timing relation with the center frequency of FM oscillator 10.

It will be appreciated that by having set the chopping frequency at 1.4 kc./s. in the present example, there can be a wide separation between this chopping frequency and the cut-off frequency of the low-pass filter (at 34), thus permitting very high loop gain at 26–28. In the same illustrative employment of the circuit, by nominally setting loop gain at 60 db, the open-loop error of the FM oscillator is reduced by a factor of 1000:1. The fifth-overtone crystal (83.3 mc./s.) at 14 is typically stable within ±0.0025 percent over a temperature range of −28° C. to +85° C. No temperature-compensation techniques are needed to achieve an overall center-frequency stability of 0.003 percent over this temperature range in production quantities; however, oven temperature compensation of the FM oscillator, in such a direction as to compensate for the crystal, has yielded ±0.001 percent stability. Center frequency is found to be unaffected by modulations up to ±100 kc./s. and with rates ranging from 1 c.p.s. to 1 mc./s.

The foregoing description covers and applies for an extended range of operation of our modified AFC loop. The one anomaly occurring in the modulation response is a beat effect (between the "audio" modulation frequency and the gate-generator rate). When these two "audio" frequencies are close enough so that their difference frequency can pass through the low-pass filter, an interfering low-frequency beat note is superposed on the modulation frequency (out of the transmitter 10). The amplitude of the beat is a function of the difference between the "audio" modulation frequency and the sampling (gate-generator) rate, the peak deviation, the low-pass filter bandwidth, and the degree of cancellation ahead of the loop amplifiers. With 40 db cancellation, and with a low-pass filter having a five-second time constant, the beat is only about one percent of the peak deviation, but the beat can increase to as much as 10 percent of the peak deviation should the degree of cancellation drop, as with temperature variation. In the illustrative example, the frequency at which the beat occurs is 1.4 kc./s.±25 c.p.s., the maximum beat occurring at 1.4 kc./s. where it is a D-C voltage of magnitude depending on the phase relation of the two frequencies ("audio" and sampling).

We have found that this beat condition may be minimized under all conditions by using a much greater time constant (which may be in the order of 200 seconds) in the low-pass filter, but unfortunately this necessitates an unduly long turn-on time for the equipment. However, the problem of turn-on time is solved by shunting a silicon diode 35 across the series resistor 36 in the low-pass filter. The shunt diode permits the low-pass filter capacitor 37 to charge very quickly during initial turn-on, but there-after it acts as a peak detector with a long discharge time constant. No beat interference is then observed or measured under any condition of operation.

It is seen that we have provided a substantial improvement in the technique of frequency-stabilizing an FM transmitter and that at the same time we have achieved this result by very substantially expanding the acceptable bandwidth of input modulating frequencies. Our technique achieves high stability and wide deviation capability by providing the basic ingredients necessary to both.

We claim:

1. In a highly stabilized FM modulator wherein an FM oscillator is modulated with audio signals of a selected bandwidth, the combination comprising:

first source means for producing frequency variable FM oscillations, the source means being coupled to the audio signals for modulation thereby, second source means for generating a reference signal having a frequency representative of the center frequency to which the FM oscillator source is to be slaved, gate-generator means for producing gating signals at a selected frequency within the passband of the audio signals, first sampling means having separate input connections to the audio-signal modulated output of the FM oscillator source and of the reference-signal source, said sampling means being actuated by the gating signals to alternately sample its input signals at a rate within the audio-signal passband as determined by the gating signals, an FM detector connected to the output of said sampling means, second sampling means actuated by the gating signals for sampling said audio signals in synchronism with the action of said first sampling means in sampling the audio signal modulated output of the FM oscillator source, differential-network means responsive to the sampled audio signal and to the FM detector output for cancelling the audio modulation in the FM detector output and providing an output signal having a D-C level which is alternately representative of the center frequency to which the FM oscillator is to be slaved and of the instantaneous center frequency of the FM oscillator source, amplifier means connected to the output of said differential-network means, third sampling means connected to the output of the amplifier means and actuated by the gating signals for producing a D-C signal representative of the deviation in frequency of the FM oscillator from the reference-signal source, AFC means responsive to the D-C signal from the third sampling means for frequency-correction tuning of the frequency-variable FM oscillator source, and a low-pass filter placed between the third sampling means and the AFC means, said filter having a preselected long-duration time constant commensurate with that necessary to maintain the beat introduced between an audio signal and the gate generator frequency below a selected percentage level of the peak deviation of the FM oscillator source.

2. The device as recited in claim 1 wherein the filter comprises:

a series resistor and a parallel capacitor forming a long time constant network and a shunting diode coupled across the resistor for speeding up the charging time of the capacitor during turn-on of the modulator.

3. The device as recited in claim 2 wherein the time constant of the filter is of the order of hundreds of seconds.

References Cited

UNITED STATES PATENTS

| | | | |
|---|---|---|---|
| 3,137,816 | 6/1964 | McLin et al. | 325—148 |
| 3,191,129 | 6/1965 | Feldman | 332—19 |
| 3,199,028 | 8/1965 | McLin et al. | 332—19 X |
| 3,297,964 | 1/1967 | Hamilton | 332—19 |
| 3,297,965 | 1/1967 | Chadima | 332—19 |

ALFRED L. BRODY, Primary Examiner

U.S. Cl. X.R.

331—14, 20, 23; 325—148